United States Patent
Sinha et al.

(10) Patent No.: US 11,222,707 B1
(45) Date of Patent: Jan. 11, 2022

(54) UTILIZATION OF CONTROL FUSES FOR FUNCTIONAL OPERATIONS IN SYSTEM-ON-CHIPS

(71) Applicant: NXP USA, Inc., Austin, TX (US)

(72) Inventors: Rohit Kumar Sinha, Noida (IN); Tomasz Szuprycinski, Nijmegen (NL); Deepak Mahajan, Noida (IN); Ruchi Bora, Lucknow (IN)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 17/247,946

(22) Filed: Dec. 31, 2020

(51) Int. Cl.
*G11C 29/02* (2006.01)

(52) U.S. Cl.
CPC ...... *G11C 29/027* (2013.01); *G11C 2229/763* (2013.01)

(58) Field of Classification Search
CPC .................. G11C 29/027; G11C 2229/763
See application file for complete search history.

(56) References Cited

U.S. PATENT DOCUMENTS

| | | | |
|---|---|---|---|
| 7,573,762 B2 | 8/2009 | Kenkare et al. | |
| 7,839,707 B2 | 11/2010 | Aakjer | |
| 9,514,840 B2 * | 12/2016 | Park | G11C 29/78 |

* cited by examiner

*Primary Examiner* — Vanthu T Nguyen

(57) ABSTRACT

A system-on-chip (SoC) includes a fuse circuit and decoding circuitry. The fuse circuit includes functional fuses, control fuses utilized as the functional fuses, and fuses configured to store override data that indicates an association between the functional fuses and the control fuses utilized as the functional fuses. The decoding circuitry is configured to output configuration data associated with a configuration of the fuse circuit based on the override data and an initial configuration of the fuse circuit. In such a scenario, functional operations of the SoC are executed based on the configuration data. Alternatively, the decoding circuitry is configured to output a set of functional data based on the override data and various functional data stored in the functional fuses and the control fuses utilized as the functional fuses. In such a scenario, the functional operations are executed based on the outputted set of functional data.

20 Claims, 4 Drawing Sheets

UTILIZATION OF CONTROL FUSES FOR FUNCTIONAL OPERATIONS IN SYSTEM-ON-CHIPS

BACKGROUND

The present disclosure relates generally to electronic circuits, and, more particularly, to utilization of control fuses for functional operations in system-on-chips.

System-on-chips (SoCs) include various fuse circuits, with each fuse circuit including various fuses. Such fuses are typically utilized for two types of operations, namely: functional operations and control operations. Fuses that store data associated with the functional operations are called functional fuses, and fuses that store data associated with the control operations are called control fuses. A common example of a functional operation is a firmware revision count operation, and that of a control operation is a memory repair operation. For the firmware revision count operations, data stored in one or more functional fuses act as a count value, whereas for the memory repair operations, data stored in one or more control fuses is indicative of redundant memories that may be utilized for repairing various defects in memories of the SoCs.

Conventionally, in an SoC, a configuration of fuse circuit is such that a fixed number of fuses are reserved to be utilized for the functional operations, and similarly, a fixed number of fuses are reserved to be utilized for the control operations. In other words, a number of functional fuses and a number of control fuses are fixed. Typically, in the SoC, various control fuses remain unutilized during an entire lifecycle of the SoC. For example, when the control fuses are utilized for the memory repair operations, a number of defects in the memories of the SoC are significantly less than the number of control fuses reserved for the memory repair operations. As a result, a utilization of the fuse circuit significantly degrades. Further, as the number of functional fuses is fixed, an additional requirement of functional fuses in the SoC results in an addition of another fuse circuit in the SoC even though various control fuses remain unutilized. As a result, a size and a manufacturing cost of the SoC significantly increases. Therefore, there exists a need for a technical solution that solves the aforementioned problems of an existing configuration of fuse circuits in SoCs.

SUMMARY

In one embodiment of the present disclosure, a system-on-chip (SoC) is disclosed. The SoC includes a fuse circuit and decoding circuitry. The fuse circuit includes first through third sets of fuses. The first set of fuses corresponds to functional fuses, and is configured to store a first set of functional data. The first set of functional data is associated with a set of functional operations of the SoC. The second set of fuses corresponds to control fuses utilized as the functional fuses. The second set of fuses is configured to store a second set of functional data. Further, the second set of functional data is associated with a subset of functional operations of the set of functional operations. The third set of fuses is configured to store override data that is indicative of an association between the second set of fuses and one or more fuses of the first set of fuses. The decoding circuitry is coupled with the fuse circuit, and configured to retrieve the override data from the fuse circuit, and receive first configuration data associated with a configuration of the fuse circuit. The decoding circuitry is further configured to output, based on the override data and the first configuration data, second configuration data associated with the configuration of the fuse circuit. The set of functional operations is executed based on the second configuration data.

In some embodiments, the SoC further includes a programming circuit that is coupled with the decoding circuitry, and configured to generate and provide the first configuration data to the decoding circuitry.

In some embodiments, the first configuration data includes a first set of functional index data associated with the fuse circuit and a first set of control index data associated with the fuse circuit.

In some embodiments, the decoding circuitry includes a processing circuit that is coupled with the fuse circuit, and configured to retrieve the override data from the fuse circuit, and generate a second set of functional index data associated with the fuse circuit and a second set of control index data associated with the fuse circuit. Each functional index data of the first and second sets of functional index data is associated with a corresponding fuse of the fuse circuit, and indicates whether the corresponding fuse is a functional fuse. Each control index data of the first and second sets of control index data is associated with a corresponding fuse of the fuse circuit, and indicates whether the corresponding fuse is a control fuse.

In some embodiments, the processing circuit is further configured to generate first and second sets of select signals based on the override data. The decoding circuitry further includes first and second sets of multiplexers that are coupled with the processing circuit. Each multiplexer of the first set of multiplexers is configured to receive first and second functional index data of the first and second sets of functional index data, respectively, and a first select signal of the first set of select signals. Each multiplexer of the first set of multiplexers is further configured to select and output, based on the first select signal, one of the first and second functional index data as third functional index data of a third set of functional index data associated with the fuse circuit. Further, each multiplexer of the second set of multiplexers is configured to receive first and second control index data of the first and second sets of control index data, respectively, and a second select signal of the second set of select signals. Each multiplexer of the second set of multiplexers is further configured to select and output, based on the second select signal, one of the first and second control index data as third control index data of a third set of control index data associated with the fuse circuit. The second configuration data includes the third set of functional index data and the third set of control index data.

In some embodiments, the SoC includes a functional circuit that is coupled with the fuse circuit, and configured to retrieve the override data from the fuse circuit, and generate a first request indicative of a first functional operation of the subset of functional operations. The SoC further includes a fuse controller that is coupled with the functional circuit, the fuse circuit, and the decoding circuitry. The fuse controller is further configured to receive the first request and the second configuration data from the functional circuit and the decoding circuitry, respectively. The fuse controller is further configured to retrieve, from the fuse circuit based on the first request and the second configuration data, first and second subsets of functional data of the first and second sets of functional data, respectively. Further, the fuse controller is configured to provide the retrieved first and second subsets of functional data to the functional circuit as a response to the first request. The functional circuit is further configured to execute the first functional operation based on the first and second subsets of functional data.

In some embodiments, the SoC includes a functional circuit that is configured to generate a second request indicative of a second functional operation of the subset of functional operations. The SoC further includes a fuse controller that is coupled with the functional circuit, the fuse circuit, and the decoding circuitry. The fuse controller is configured to receive the second request and the second configuration data from the functional circuit and the decoding circuitry, respectively. The fuse controller is further configured to retrieve, from the fuse circuit based on the second request and the second configuration data, third and fourth subsets of functional data of the first and second sets of functional data, respectively. Further, the fuse controller is configured to execute one of first and second reliability operations on the retrieved third and fourth subsets of functional data to generate output data, and provide the output data to the functional circuit as a response to the second request. The functional circuit is further configured to execute the second functional operation based on the output data.

In some embodiments, the first reliability operation corresponds to a logical OR operation that is executed on first and second functional data of the third and fourth subsets of functional data, respectively, and the second reliability operation corresponds to one of a logical OR operation and a redundancy operation that is executed on third and fourth functional data of the third subset of functional data and fifth functional data of the fourth subset of functional data.

In some embodiments, the decoding circuitry includes a processing circuit that is coupled with the fuse circuit, and configured to retrieve the override data from the fuse circuit. When the first reliability operation is to be executed for the second functional operation, the first configuration data further includes a first set of reliability index data associated with the fuse circuit. Further, the processing circuit is configured to generate a second set of reliability index data associated with the fuse circuit based on the override data. Each reliability index data of the first set of reliability index data is associated with a corresponding fuse of the fuse circuit. Further, first reliability index data of the first set of reliability index data is indicative of a first fuse pair that is associated with the fuse circuit and facilitates the execution of the first reliability operation. Similarly, each reliability index data of the second set of reliability index data is associated with a corresponding fuse of the fuse circuit. Further, second reliability index data of the second set of reliability index data is indicative of a second fuse pair that is associated with the fuse circuit and facilitates the execution of the first reliability operation.

In some embodiments, the processing circuit is further configured to generate a third set of select signals based on the override data, and the decoding circuitry further includes a third set of multiplexers that is coupled with the processing circuit. Each multiplexer of the third set of multiplexers is configured to receive the first and second reliability index data of the first and second sets of reliability index data, respectively, and a third select signal of the third set of select signals. Each multiplexer of the third set of multiplexers is further configured to select and output, based on the third select signal, one of the first and second reliability index data as third reliability index data of a third set of reliability index data associated with the fuse circuit. The second configuration data includes the third set of reliability index data.

In some embodiments, the decoding circuitry includes a processing circuit that is coupled with the fuse circuit, and configured to retrieve the override data from the fuse circuit. When the second reliability operation is to be executed for the second functional operation, the first configuration data includes fourth and fifth sets of reliability index data associated with the fuse circuit. Further, the processing circuit is configured to generate sixth and seventh sets of reliability index data associated with the fuse circuit based on the override data. Each reliability index data of the fourth and fifth sets of reliability index data is associated with a corresponding fuse of the fuse circuit. Further, fourth and fifth reliability index data of the fourth and fifth sets of reliability index data, respectively, are indicative of a first fuse triplet that is associated with the fuse circuit and facilitates the execution of the second reliability operation. Each reliability index data of the sixth and seventh sets of reliability index data is associated with a corresponding fuse of the fuse circuit. Further, sixth and seventh reliability index data of the sixth and seventh sets of reliability index data, respectively, are indicative of a second fuse triplet that is associated with the fuse circuit and facilitates the execution of the second reliability operation.

In some embodiments, the processing circuit is further configured to generate a fourth set of select signals based on the override data, and the decoding circuitry further includes fourth and fifth sets of multiplexers that are coupled with the processing circuit. Each multiplexer of the fourth set of multiplexers is configured to receive the fourth and sixth reliability index data of the fourth and sixth sets of reliability index data and a fourth select signal of the fourth set of select signals. Each multiplexer of the fourth set of multiplexers is further configured to select and output, based on the fourth select signal, one of the fourth and sixth reliability index data as eighth reliability index data of an eighth set of reliability index data associated with the fuse circuit. Further, each multiplexer of the fifth set of multiplexers is configured to receive the fifth and seventh reliability index data of the fifth and seventh sets of reliability index data, respectively, and the fourth select signal. Each multiplexer of the fifth set of multiplexers is further configured to select and output, based on the fourth select signal, one of the fifth and seventh reliability index data as ninth reliability index data of a ninth set of reliability index data associated with the fuse circuit. The second configuration data includes the eighth and ninth sets of reliability index data.

In some embodiments, the fuse circuit further includes a fourth set of fuses that corresponds to the control fuses, and is configured to store a set of control data. The set of control data is associated with a set of control operations of the SoC.

In some embodiments, the SoC further includes a memory controller that is configured to generate a third request indicative of a control operation of the set of control operations, and a fuse controller that is coupled with the memory controller, the fuse circuit, and the decoding circuitry. The fuse controller is configured to receive the third request and the second configuration data from the memory controller and the decoding circuitry, respectively. The fuse controller is further configured to retrieve, from the fuse circuit based on the third request and the second configuration data, a subset of control data of the set of control data, and provide the retrieved subset of control data to the memory controller as a response to the third request. The memory controller is further configured to execute the control operation based on the subset of control data.

In another embodiment of the present disclosure, a system-on-chip (SoC) is disclosed. The SoC includes a fuse circuit and decoding circuitry. The fuse circuit includes first through third sets of fuses. The first set of fuses corresponds to functional fuses, and is configured to store a first set of functional data. The first set of functional data is associated with a set of functional operations of the SoC. The second set of fuses corresponds to control fuses utilized as the functional fuses. The second set of fuses is configured to store a second set of functional data. Further, the second set of functional data is associated with a subset of functional operations of the set of functional operations. The third set of fuses is configured to store override data. The override data is indicative of an association between the second set of fuses and one or more fuses of the first set of fuses. The decoding circuitry is coupled with the fuse circuit, and configured to retrieve the override data from the fuse circuit, and receive, from the fuse circuit, a first subset of functional data of the first set of functional data and the second set of functional data. Further, the decoding circuitry is configured to output a third set of functional data based on the override data, the first subset of functional data, and the second set of functional data. The set of functional operations is executed based on the third set of functional data.

In some embodiments, the decoding circuitry includes a processing circuit that is coupled with the fuse circuit, and configured to retrieve the override data from the fuse circuit, and generate a set of select signals. The decoding circuitry further includes a set of multiplexers that is coupled with the fuse circuit and the processing circuit. Each multiplexer of the set of multiplexers is configured to receive a select signal of the set of select signals and first and second functional data of the first subset of functional data and the second set of functional data, respectively. Each multiplexer of the set of multiplexers is further configured to select and output, based on the select signal, one of the first and second functional data as third functional data of the third set of functional data.

In some embodiments, the SoC includes a functional circuit that is coupled with the fuse circuit, and configured to retrieve the override data from the fuse circuit, and generate a first request indicative of a first functional operation of the subset of functional operations. The SoC further includes a fuse controller that is coupled with the functional circuit, the decoding circuitry, and the fuse circuit. The fuse controller is configured to receive the first request and the third set of functional data from the functional circuit and the decoding circuitry, respectively. The fuse controller is further configured to retrieve, from the fuse circuit based on the first request, a second subset of functional data of the first set of functional data. Further, the fuse controller is configured to identify, from the third set of functional data, a third subset of functional data that is associated with the first request, and provide the second and third subsets of functional data to the functional circuit as a response to the first request. The functional circuit is further configured to execute the first functional operation based on the second and third subsets of functional data.

In some embodiments, the SoC includes a functional circuit that is configured to generate a second request indicative of a second functional operation of the subset of functional operations. The SoC further includes a fuse controller that is coupled with the functional circuit, the fuse circuit, and the decoding circuitry. The fuse controller is configured to receive the second request and the third set of functional data from the functional circuit and the decoding circuitry, respectively. The fuse controller is further configured to retrieve, from the fuse circuit based on the second request, a fourth subset of functional data of the first set of functional data. Further, the fuse controller is configured to identify, from the third set of functional data, a fifth subset of functional data that is associated with the second request, execute one of first and second reliability operations on the fourth and fifth subsets of functional data to generate output data, and provide the output data to the functional circuit as a response to the second request. The functional circuit is further configured to execute the second functional operation based on the output data.

In some embodiments, the first reliability operation corresponds to a logical OR operation that is executed on fourth and fifth functional data of the fourth and fifth subsets of functional data and the second reliability operation corresponds to one of a logical OR operation and a redundancy operation that is executed on sixth and seventh functional data of the fourth subset of functional data and eighth functional data of the fifth subset of functional data.

In some embodiments, the fuse circuit further includes a fourth set of fuses that corresponds to the control fuses, and is configured to store a set of control data. The set of control data is associated with a set of control operations of the SoC.

Various embodiments of the present disclosure disclose an SoC that includes a fuse circuit and decoding circuitry. The fuse circuit includes functional fuses and control fuses utilized as the functional fuses. The functional fuses and the control fuses utilized as the functional fuses are configured to store first and second sets of functional data, respectively. The first set of functional data is associated with a set of functional operations of the SoC, and the second set of functional data is associated with a subset of functional operations of the set of functional operations. The fuse circuit further includes one or more fuses that are configured to store override data. The override data is indicative of an association between one or more functional fuses and the control fuses utilized as the functional fuses. The decoding circuitry is configured to retrieve the override data from the fuse circuit. Further, the decoding circuitry is configured to output configuration data associated with the fuse circuit where the control fuses are utilized as the functional fuses based on the override data and an initial configuration of the fuse circuit. In such a scenario, the set of functional operations is executed based on the outputted configuration data. Alternatively, the decoding circuitry may be configured to receive, from the fuse circuit, a first subset of functional data of the first set of functional data and the second set of functional data, and output a third set of functional data based on the override data, the first subset of functional data, and the second set of functional data. In such a scenario, the set of functional operations is executed based on the third set of functional data.

Thus, in the SoC of the present disclosure, one or more unutilized control fuses that are reserved to be utilized for one or more control operations are utilized for various functional operations (e.g., the subset of functional operations). The utilization of various unutilized control fuses as the functional fuses results in an increase in a number of functional fuses available for the set of functional operations. The increased number of functional fuses may be utilized for increasing a reliability of various functional operations of the set of functional operations or for fulfilling an additional requirement of functional fuses in the SoC. As a result, a utilization of the fuse circuit of the present disclosure is greater than that of a fuse circuit of a conventional SoC where a configuration of the fuse circuit is fixed. Further, as the increased number of functional fuses may be utilized for fulfilling the additional requirement of functional fuses in the SoC, a need for adding another fuse circuit in an SoC to fulfil the additional requirement of functional fuses is eliminated. Hence, a size and a manufacturing cost of the SoC of the present disclosure are significantly less than that of the conventional SoC that requires another fuse circuit to fulfil the additional requirement of functional fuses.

BRIEF DESCRIPTION OF THE DRAWINGS

The following detailed description of the preferred embodiments of the present disclosure will be better understood when read in conjunction with the appended drawings. The present disclosure is illustrated by way of example, and not limited by the accompanying figures, in which like references indicate similar elements.

DETAILED DESCRIPTION

The detailed description of the appended drawings is intended as a description of the currently preferred embodiments of the present disclosure, and is not intended to represent the only form in which the present disclosure may be practiced. It is to be understood that the same or equivalent functions may be accomplished by different embodiments that are intended to be encompassed within the spirit and scope of the present disclosure.

Figure 1:
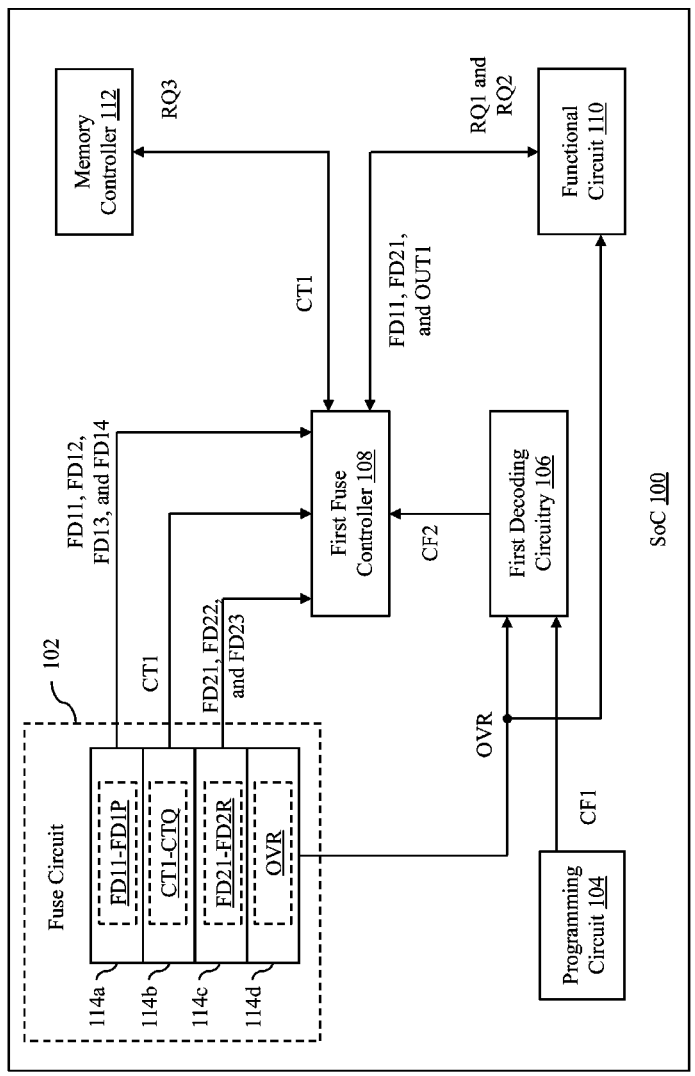
FIG. 1 illustrates a schematic block diagram of a system-on-chip (SoC) in accordance with an embodiment of the present disclosure.

FIG. 1 illustrates a schematic block diagram of a system-on-chip (SoC) 100 in accordance with an embodiment of the present disclosure. The SoC 100 includes a fuse circuit 102, a programming circuit 104, first decoding circuitry 106, a first fuse controller 108, a functional circuit 110, and a memory controller 112. The SoC 100 may be included in various devices such as automotive devices, network devices, or the like.

The fuse circuit 102 includes various fuses that are configured to store various data associated with various operations of the SoC 100. In one embodiment, each fuse is configured to store one byte of data. Such fuses may be functional fuses or control fuses. The functional fuses are configured to store various functional data that are utilized for executing various functional operations of the SoC 100. In an example, the functional operations of the SoC 100 correspond to firmware revision count operations, and the functional data act as a count value. Similarly, the control fuses are configured to store various control data that are utilized for executing various control operations of the SoC 100. Examples of the control operations of the SoC 100 include memory repair operations, trim operations, or the like. When the control operations correspond to the memory repair operations, the control data is indicative of redundant memories that may be utilized for repairing various memory defects. In the present disclosure, one or more control fuses that are unutilized for the control operations are utilized for the functional operations. The fuse circuit 102 thus includes first through third sets of fuses 114a-114c, where the first and second sets of fuses 114a and 114b correspond to the functional and control fuses, respectively, and the third set of fuses 114c corresponds to the control fuses that are utilized as the functional fuses in the SoC 100.

The first set of fuses 114a is configured to store a first set of functional data FD11-FD1P. The first set of functional data FD11-FD1P is associated with a set of functional operations of the SoC 100. In one embodiment, one functional data of the first set of functional data FD11-FD1P is associated with one functional operation of the set of functional operations. In another embodiment, two or more functional data of the first set of functional data FD11-FD1P is associated with one functional operation of the set of functional operations. The second set of fuses 114b is configured to store a set of control data CT1-CTQ. The set of control data CT1-CTQ is associated with a set of control operations of the SoC 100. In one embodiment, one control data of the set of control data CT1-CTQ is associated with one control operation of the set of control operations. In another embodiment, two or more control data of the set of control data CT1-CTQ is associated with one control operation of the set of control operations. For the sake of ongoing discussion and without deviating from the scope of the present disclosure, it is assumed that the set of control operations correspond to memory repair operations associated with a set of memories (not shown) that is coupled with the memory controller 112.

The third set of fuses 114c is configured to store a second set of functional data FD21-FD2R. The second set of functional data FD21-FD2R is associated with a subset of functional operations of the set of functional operations. In one embodiment, one functional data of the second set of functional data FD21-FD2R is associated with one functional operation of the subset of functional operations. In another embodiment, two or more functional data of the second set of functional data FD21-FD2R is associated with one functional operation of the subset of functional operations.

The fuse circuit 102 further includes a fourth set of fuses 114d that is configured to store override data OVR. In an embodiment, the override data OVR may be generated by a core circuit (not shown) of the SoC 100. The override data OVR is indicative of an association between the third set of fuses 114c and one or more fuses of the first set of fuses 114a. The one or more fuses of the first set of fuses 114a correspond to the fuses that are associated with the subset of functional operations. Thus, each functional operation of the subset of functional operations is associated with one or more functional data of the first set of functional data FD11-FD1P and one or more functional data of the second set of functional data FD21-FD2R. In an embodiment, the override data OVR includes addresses (i.e., indexes) of the one or more fuses of the first set of fuses 114a. Thus, a number of fuses to be included in the third set of fuses 114c may be controlled by way of the override data OVR (i.e., by modifying the addresses included in the override data OVR). Further, the addresses of the one or more fuses of the first set of fuses 114a are included in an order that is same as an order of the third set of fuses 114c, thereby providing the association between the third set of fuses 114c and the one or more fuses of the first set of fuses 114a.

The programming circuit 104 may include suitable logic, circuitry, interfaces, and/or code, executable by the circuitry, that may be configured to perform one or more operations. For example, the programming circuit 104 is configured to generate first configuration data CF1 that is associated with a configuration of the fuse circuit 102. The configuration of the fuse circuit 102 corresponds to segregation of fuses of the fuse circuit 102 into fuses that are reserved to be utilized for functional and control operations. The first configuration data CF1 is indicative of an initial configuration of the SoC 100. The initial configuration of the SoC 100 indicates that the first set of fuses 114a are reserved to be utilized for the functional operations and the second and third sets of fuses 114b and 114c are reserved to be utilized for the control operations. The first configuration data CF1 includes a first set of functional index data associated with the fuse circuit 102 of which first functional index is shown later in FIG. 2, and a first set of control index data associated with the fuse circuit 102 of which first control index data is shown later in FIG. 2. Each functional index data of the first set of functional index data is associated with a corresponding fuse of the fuse circuit 102, and indicates whether the corresponding fuse is a functional fuse. Similarly, each control index data of the first set of control index data is associated with a corresponding fuse of the fuse circuit 102, and indicates whether the corresponding fuse is a control fuse.

When a first reliability operation is to be executed to facilitate execution of various functional operations, the first configuration data CF1 further includes a first set of reliability index data associated with the fuse circuit 102 of which first reliability index data is shown later in FIG. 2. Each reliability index data of the first set of reliability index data is associated with a corresponding fuse of the fuse circuit 102. Further, each reliability index data of the first set of reliability index data is indicative of a first fuse pair that is associated with the fuse circuit 102 and facilitates the execution of the first reliability operation. For example, if one reliability index data of the first set of reliability index data that is associated with a first fuse (not shown) of the first set of fuses 114a includes an address (i.e., an index) of a second fuse (not shown) of the third set of fuses 114c, the first and second fuses form the first fuse pair. In other words, the functional data stored in the first and second fuses are associated with a same functional operation of the subset of functional operations. In such a scenario, the first reliability operation is executed on the functional data stored in the first and second fuses to facilitate the execution of the corresponding functional operation. In an embodiment, the first reliability operation corresponds to a logical OR operation, more specifically, a double-OR operation (i.e., a logical OR operation that is executed on two data).

When a second reliability operation is to be executed to facilitate the execution of various functional operations, the first configuration data CF1 further includes second and third sets of reliability index data associated with the fuse circuit 102 of which second and third reliability index data are shown later in FIG. 2, respectively. Each reliability index data of the second and third sets of reliability index data is associated with a corresponding fuse of the fuse circuit 102. Further, two reliability index data (i.e., one reliability index data of each of the second and third sets of reliability index data) that are associated with a same fuse are indicative of a first fuse triplet. The first fuse triplet is associated with the fuse circuit 102 and facilitates the execution of the second reliability operation. In an example, one reliability index data of the second set of reliability index data that is associated with a third fuse (not shown) of the first set of fuses 114a includes an address (i.e., an index) of a fourth fuse (not shown) of the first set of fuses 114a. Further, one reliability index data of the third set of reliability index data that is associated with the third fuse includes an address (i.e., an index) of a fifth fuse (not shown) of the third set of fuses 114c. In such a scenario, the third through fifth fuses form the first fuse triplet. In other words, the functional data stored in the third through fifth fuses are associated with a same functional operation of the subset of functional operations. In such a scenario, the second reliability operation is executed on the functional data stored in the third through fifth fuses to facilitate the execution of the corresponding functional operation. In an embodiment, the second reliability operation corresponds to a logical OR operation, more specifically, a triple-OR operation (i.e., a logical OR operation executed on three data).

When a third reliability operation is to be executed to facilitate the execution of various functional operations, the first configuration data CF1 further includes fourth and fifth sets of reliability index data associated with the fuse circuit 102 of which fourth and fifth reliability index data are shown later in FIG. 2, respectively. Each reliability index data of the fourth and fifth sets of reliability index data is associated with a corresponding fuse of the fuse circuit 102. Further, two reliability index data (i.e., one reliability index data of each of the fourth and fifth sets of reliability index data) that are associated with a same fuse are indicative of a second fuse triplet. The second fuse triplet is associated with the fuse circuit 102 and facilitates the execution of the third reliability operation. In an example, one reliability index data of the fourth set of reliability index data that is associated with a sixth fuse (not shown) of the first set of fuses 114a includes an address (i.e., an index) of a seventh fuse (not shown) of the first set of fuses 114a. Further, one reliability index data of the fifth set of reliability index data that is associated with the sixth fuse includes an address (i.e., an index) of an eighth fuse (not shown) of the third set of fuses 114c. In such a scenario, the sixth through eighth fuses form the second fuse triplet. In other words, the functional data stored in the sixth through eighth fuses are associated with a same functional operation of the subset of functional operations. In such a scenario, the third reliability operation is executed on the functional data stored in the sixth through eighth fuses to facilitate the execution of the corresponding functional operation. In an embodiment, the third reliability operation corresponds to a redundancy operation, more specifically, a triple-voting operation. In one example, the programming circuit 104 corresponds to a register transfer logic (RTL) circuit.

The first decoding circuitry 106 is coupled with the fuse circuit 102 (i.e., the fourth set of fuses 114d), and configured to retrieve the override data OVR from the fuse circuit 102. The first decoding circuitry 106 is further coupled with the programming circuit 104, and configured to receive the first configuration data CF1. Based on the first configuration data CF1 and the override data OVR, the first decoding circuitry 106 is further configured to output second configuration data CF2 that is associated with the configuration of the fuse circuit 102. The set of functional operations and the set of control operations are executed based on the second configuration data CF2. The structure of the first decoding circuitry 106 and the generation of the second configuration data CF2 are explained in detail in conjunction with FIG. 2.

The first fuse controller 108 is coupled with the fuse circuit 102, the first decoding circuitry 106, the functional circuit 110, and the memory controller 112. The first fuse controller 108 may include suitable logic, circuitry, interfaces, and/or code, executable by the circuitry, that may be configured to perform one or more operations. For example, the first fuse controller 108 is configured to receive the second configuration data CF2 from the first decoding circuitry 106.

The first fuse controller 108 may be configured to receive various requests from the functional circuit 110. For example, the first fuse controller 108 is further configured to receive, from the functional circuit 110, a first request RQ1 that is indicative of a first functional operation of the subset of functional operations. In such a scenario, the first fuse controller 108 is further configured to retrieve, from the fuse circuit 102 based on the first request RQ1 and the second configuration data CF2, first and second subsets of functional data of the first and second sets of functional data FD11-FD1P and FD21-FD2R, respectively. For the sake of brevity, it is assumed that the first subset of functional data includes first functional data FD11 and the second subset of functional data includes second functional data FD21. The first fuse controller 108 is further configured to provide the retrieved first and second functional data FD11 and FD21 to the functional circuit 110 as a response to the first request RQ1. Further, the first functional operation is executed by the functional circuit 110 based on the first and second functional data FD11 and FD21.

The first fuse controller 108 may similarly be configured to receive a second request RQ2 that is indicative of a second functional operation of the subset of functional operations. For the sake of ongoing discussion, it is assumed that the second request RQ2 indicates that one of the first through third reliability operations is to be executed to facilitate the execution of the second functional operation. In such a scenario, the first fuse controller 108 is further configured to retrieve, from the fuse circuit 102 based on the second request RQ2 and the second configuration data CF2, third and fourth subsets of functional data of the first and second sets of functional data FD11-FD1P and FD21-FD2R, respectively. The first fuse controller 108 is further configured to execute one of the first through third reliability operations on the retrieved third and fourth subsets of functional data to generate first output data OUT1.

When the second request RQ2 indicates that the first reliability operation is to be executed for the second functional operation, the third and fourth subsets of functional data includes one functional data each (e.g., third and fourth functional data FD12 and FD22). In such a scenario, the first fuse controller 108 is further configured to execute a logical OR operation on the third and fourth functional data FD12 and FD22 to generate the first output data OUT1. Similarly, when the second request RQ2 indicates that the second or third reliability operation is to be executed for the second functional operation, the third subset of functional data includes two functional data (e.g., fifth and sixth functional data FD13 and FD14) and the fourth subset of functional data includes one functional data (e.g., seventh functional data FD23). In such a scenario, the first fuse controller 108 is further configured to execute one of the second and third reliability operations on the fifth through seventh functional data FD13, FD14, and FD23 to generate the first output data OUT1. The first fuse controller 108 is further configured to provide the first output data OUT1 to the functional circuit 110 as a response to the second request RQ2.

The second functional operation is executed by the functional circuit 110 based on the first output data OUT1. In an embodiment, the second request RQ2 indicates whether the first, second, or third reliability operation is to be executed based on a number of fuses included in the third set of fuses 114c (i.e., a number of control fuses that are utilized as functional fuses). Thus, for example, if the number of fuses included in the third set of fuses 114c increases, the second or third reliability operation may be executed instead of the first reliability operation (i.e., a reliability of a corresponding functional operation may be increased).

Although it is described that the first through third reliability operations (e.g., a double-OR operation, a triple-OR operation, and a triple-voting operation, respectively) are executed to facilitate the execution of various functional operations, it will be apparent to a person skilled in the art that the scope of the present disclosure is not limited to it. In various other embodiments, various other reliability operations (such as a quadruple-OR operation) may be executed to facilitate the execution of various functional operations, without deviating from the scope of the present disclosure.

The first fuse controller 108 may similarly be configured to receive various requests from the memory controller 112. For example, the first fuse controller 108 is further configured to receive, from the memory controller 112, a third request RQ3 that is indicative of a control operation of the set of control operations. For the sake of ongoing discussion, it is assumed that the first control operation corresponds to a memory repair operation associated with a first memory (not shown) of the set of memories. In such a scenario, the first fuse controller 108 is further configured to retrieve, from the fuse circuit 102 based on the third request RQ3 and the second configuration data CF2, a first subset of control data of the set of control data CT1-CTQ. For the sake of brevity, it is assumed that the first subset of control data includes first control data CT1. The first fuse controller 108 is further configured to provide the retrieved first control data CT1 to the memory controller 112 as a response to the third request RQ3. Further, the first control operation is executed by the memory controller 112 based on the first control data CT1.

The functional circuit 110 is coupled with the fuse circuit 102 (i.e., the fourth set of fuses 114d). The functional circuit 110 may include suitable logic, circuitry, interfaces, and/or code, executable by the circuitry, that may be configured to perform one or more operations. For example, the functional circuit 110 is configured to retrieve the override data OVR from the fuse circuit 102. Based on the override data OVR, the functional circuit 110 is further configured to generate various requests indicative of various functional operations. For example, the functional circuit 110 is further configured to generate, based on the override data OVR, the first request RQ1 that is indicative of the first functional operation. The functional circuit 110 is further configured to provide the first request RQ1 to the first fuse controller 108. In response to the first request RQ1, the functional circuit 110 is further configured to receive the first and second functional data FD11 and FD21 from the first fuse controller 108. Further, based on the first and second functional data FD11 and FD21, the functional circuit 110 is configured to execute the first functional operation.

The functional circuit 110 is further configured to generate the second request RQ2 that is indicative of the second functional operation. The functional circuit 110 is further configured to provide the second request RQ2 to the first fuse controller 108. In response to the second request RQ2, the functional circuit 110 is further configured to receive the first output data OUT1 from the first fuse controller 108. Further, based on the first output data OUT1, the functional circuit 110 is configured to execute the second functional operation. Examples of the functional circuit 110 may include a processor, a system controller, or the like.

The memory controller 112 is coupled with the set of memories. The memory controller 112 may include suitable logic, circuitry, interfaces, and/or code, executable by the circuitry, that may be configured to perform one or more operations. For example, the memory controller 112 may be configured to generate various requests indicative of various control operations associated with the set of memories. For example, the memory controller 112 is configured to generate the third request RQ3 that is indicative of the first control operation associated with the first memory. The memory controller 112 is further configured to provide the third request RQ3 to the first fuse controller 108. In response to the third request RQ3, the memory controller 112 is further configured to receive the first control data CT1 from the first fuse controller 108. Further, based on the first control data CT1, the memory controller 112 is configured to execute the first control operation on the first memory. It will be apparent to a person skilled in the art that the memory controller 112 may execute control operations (i.e., memory repair operations) on other memories of the set of memories in a manner similar to that described above.

It will be apparent to a person skilled in the art that the scope of the present disclosure is not limited to the first control operation being a memory repair operation. In various other embodiments, the first control operation may correspond to various other control operations of the SoC 100 (such as a trim operation) without deviating from the scope of the present disclosure. Such control operations may be executed in a manner similar to the execution of the memory repair operation described above. However, in such a scenario, the functions executed by the memory controller 112 may be executed by the functional circuit 110.

Figure 2:
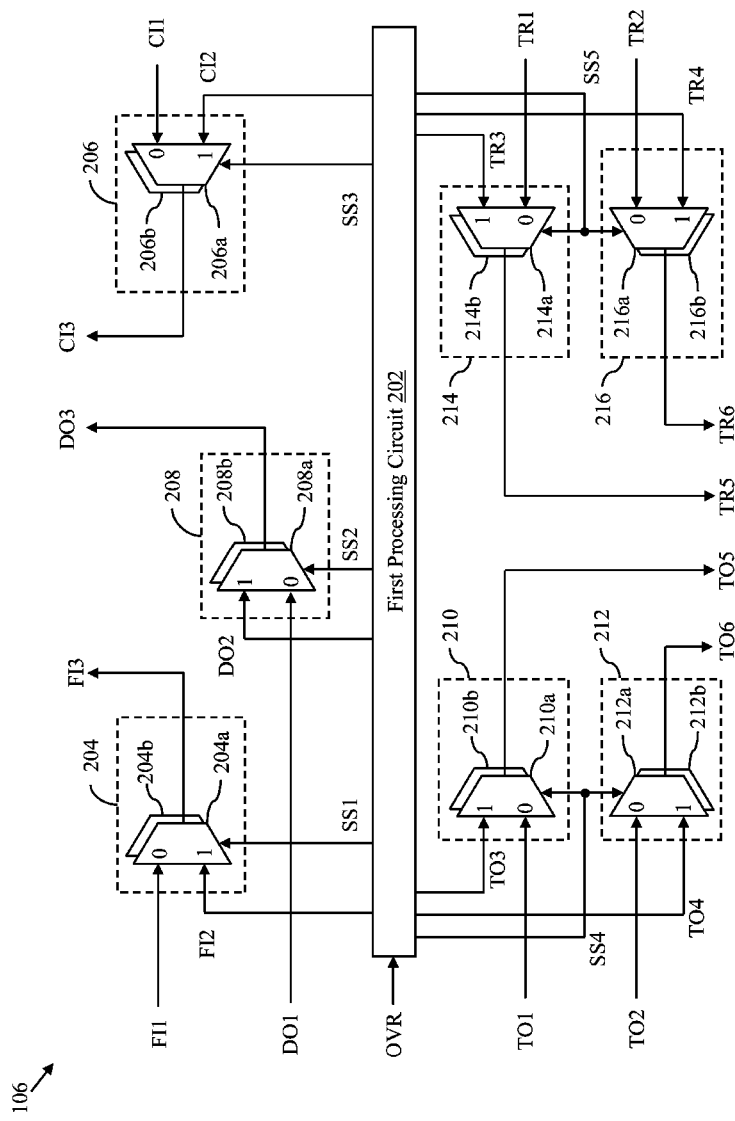
FIG. 2 illustrates a schematic block diagram of first decoding circuitry of the SoC of FIG. 1 in accordance with an embodiment of the present disclosure.

FIG. 2 illustrates a schematic block diagram of the first decoding circuitry 106 in accordance with an embodiment of the present disclosure. The first decoding circuitry 106 receives the first configuration data CF1 from the programming circuit 104. The first configuration data CF1 includes the first set of functional index data of which the first functional index (hereinafter referred to and designated as "the first functional index data FI1") is shown, and the first set of control index data of which the first control index data (hereinafter referred to and designated as "the first control index data CI1") is shown. The first configuration data CF1 further includes the first set of reliability index data of which the first reliability index data (hereinafter referred to and designated as "the first reliability index data DO1") is shown. Further, the first configuration data CF1 includes the second and third sets of reliability index data of which the second and third reliability index data (hereinafter referred to and designated as "the second and third reliability index data TO1 and TO2") are shown, respectively. The first configuration data CF1 further includes the fourth and fifth sets of reliability index data of which the fourth and fifth reliability index data (hereinafter referred to and designated as "the fourth and fifth reliability index data TR1 and TR2") are shown, respectively.

The first decoding circuitry 106 includes a first processing circuit 202 that is coupled with the fuse circuit 102 (i.e., the fourth set of fuses 114d). The first processing circuit 202 may include suitable logic, circuitry, interfaces, and/or code, executable by the circuitry, that may be configured to perform one or more operations. For example, the first processing circuit 202 is configured to retrieve the override data OVR from the fuse circuit 102. Based on the override data OVR, the first processing circuit 202 is configured to generate a second set of functional index data associated with the fuse circuit 102 of which second functional index data FI2 is shown, and a second set of control index data associated with the fuse circuit 102 of which second control index data CI2 is shown. Each functional index data of the second set of functional index data is associated with a corresponding fuse of the fuse circuit 102, and indicates whether the corresponding fuse is a functional fuse. Similarly, each control index data of the second set of control index data is associated with a corresponding fuse of the fuse circuit 102, and indicates whether the corresponding fuse is a control fuse.

When the first reliability operation is to be executed to facilitate the execution of various functional operations, the first processing circuit 202 is further configured to generate, based on the override data OVR, a sixth set of reliability index data associated with the fuse circuit 102 of which sixth reliability index data DO2 is shown. Each reliability index data of the sixth set of reliability index data is associated with a corresponding fuse of the fuse circuit 102. Further, each reliability index data of the sixth set of reliability index data is indicative of a second fuse pair that is associated with the fuse circuit 102 and facilitates the execution of the first reliability operation.

When the second reliability operation is to be executed to facilitate the execution of various functional operations, the first processing circuit 202 is further configured to generate, based on the override data OVR, seventh and eighth sets of reliability index data associated with the fuse circuit 102 of which seventh and eighth reliability index data TO3 and TO4 are shown, respectively. Each reliability index data of the seventh and eighth sets of reliability index data is associated with a corresponding fuse of the fuse circuit 102. Further, two reliability index data (i.e., one reliability index data of each of the seventh and eighth sets of reliability index data) that are associated with a same fuse are indicative of a third fuse triplet. The third fuse triplet is associated with the fuse circuit 102 and facilitates the execution of the second reliability operation.

When the third reliability operation is to be executed to facilitate the execution of various functional operations, the first processing circuit 202 is further configured to generate, based on the override data OVR, ninth and tenth sets of reliability index data associated with the fuse circuit 102 of which ninth and tenth reliability index data TR3 and TR4 are shown, respectively. Each reliability index data of the ninth and tenth sets of reliability index data is associated with a corresponding fuse of the fuse circuit 102. Further, two reliability index data (i.e., one reliability index data of each of the ninth and tenth sets of reliability index data) that are associated with a same fuse are indicative of a fourth fuse triplet. The fourth fuse triplet is associated with the fuse circuit 102 and facilitates the execution of the third reliability operation. The second set of functional index data, the second set of control index data, and the sixth through tenth sets of reliability index data constitute third configuration data (not shown) that is associated with the configuration of the fuse circuit 102.

The first processing circuit 202 is further configured to generate, based on the override data OVR, various sets of select signals to facilitate the generation of the second configuration data CF2. For example, the first processing circuit 202 is further configured to generate, based on the override data OVR, first through fifth sets of select signals of which first through fifth select signals SS1-SS5 are shown, respectively.

The first decoding circuitry 106 further includes a first set of multiplexers 204 of which first and second multiplexers 204a and 204b are shown. It will be apparent to a person skilled in the art that the first set of multiplexers 204 is shown to include two multiplexers (i.e., the first and second multiplexers 204a and 204b) to make the illustrations concise and clear, and should not be considered as a limitation of the present disclosure. A number of multiplexers included in the first set of multiplexers 204 is equal to the number of fuses of the fuse circuit 102.

The first set of multiplexers 204 is coupled with the programming circuit 104, and configured to receive the first set of functional index data. Similarly, the first set of multiplexers 204 is coupled with the first processing circuit 202, and configured to receive the second set of functional index data. Further, the first set of multiplexers 204 is configured to receive the first set of select signals from the first processing circuit 202. For example, the first multiplexer 204a has a first input terminal that is coupled with the programming circuit 104, and configured to receive the first functional index data FI1 of the first set of functional index data. The first multiplexer 204a further has a second input terminal and a select terminal that are coupled with the first processing circuit 202, and configured to receive the second functional index data FI2 of the second set of functional index data and the first select signal SS1 of the first set of select signals, respectively.

The first multiplexer 204a is further configured to select and output, at an output terminal thereof based on the first select signal SS1, one of the first and second functional index data FI1 and FI2 as third functional index data FI3 of a third set of functional index data associated with the fuse circuit 102. In an embodiment, when the first processing circuit 202 deactivates the first select signal SS1 (i.e., generates the first select signal SS1 at a logic low state), the first functional index data FI1 is selected and outputted as the third functional index data FI3. Further, when the first processing circuit 202 activates the first select signal SS1 (i.e., generates the first select signal SS1 at a logic high state), the second functional index data FI2 is selected and outputted as the third functional index data FI3. It will be apparent to a person skilled in the art that each multiplexer of the first set of multiplexers 204 (such as the second multiplexer 204b) may output corresponding functional index data of the third set of functional index data in a similar manner as described above. Thus, based on the first set of select signals, the first set of multiplexers 204 is further configured to select and output one of the first and second sets of functional index data as the third set of functional index data.

The first decoding circuitry 106 further includes a second set of multiplexers 206 of which third and fourth multiplexers 206a and 206b are shown. It will be apparent to a person skilled in the art that the second set of multiplexers 206 is shown to include two multiplexers (i.e., the third and fourth multiplexers 206a and 206b) to make the illustrations concise and clear, and should not be considered as a limitation of the present disclosure. A number of multiplexers included in the second set of multiplexers 206 is equal to the number of fuses of the fuse circuit 102.

The second set of multiplexers 206 is coupled with the programming circuit 104, and configured to receive the first set of control index data. The second set of multiplexers 206 is further coupled with the first processing circuit 202, and configured to receive the second set of control index data. Further, the second set of multiplexers 206 is configured to receive the second set of select signals from the first processing circuit 202. For example, the third multiplexer 206a has a first input terminal that is coupled with the programming circuit 104, and configured to receive the first control index data CI1 of the first set of control index data. The third multiplexer 206a further has a second input terminal and a select terminal that are coupled with the first processing circuit 202, and configured to receive the second control index data CI2 of the second set of control index data and the second select signal SS2 of the second set of select signals, respectively.

The third multiplexer 206a is further configured to select and output, at an output terminal thereof based on the second select signal SS2, one of the first and second control index data CI1 and CI2 as third control index data CI3 of a third set of control index data associated with the fuse circuit 102. In an embodiment, when the first processing circuit 202 deactivates the second select signal SS2 (i.e., generates the second select signal SS2 at a logic low state), the first control index data CI1 is selected and outputted as the third control index data CI3. Further, when the first processing circuit 202 activates the second select signal SS2 (i.e., generates the second select signal SS2 at a logic high state), the second control index data CI2 is selected and outputted as the third control index data CI3. It will be apparent to a person skilled in the art that each multiplexer of the second set of multiplexers 206 (such as the fourth multiplexer 206b) may output corresponding control index data of the third set of control index data in a similar manner as described above. Thus, based on the second set of select signals, the second set of multiplexers 206 is further configured to select and output one of the first and second sets of control index data as the third set of control index data.

The first decoding circuitry 106 further includes a third set of multiplexers 208 of which fifth and sixth multiplexers 208a and 208b are shown. It will be apparent to a person skilled in the art that the third set of multiplexers 208 is shown to include two multiplexers (i.e., the fifth and sixth multiplexers 208a and 208b) to make the illustrations concise and clear, and should not be considered as a limitation of the present disclosure. A number of multiplexers included in the third set of multiplexers 208 is equal to the number of fuses of the fuse circuit 102.

The third set of multiplexers 208 is coupled with the programming circuit 104, and configured to receive the first set of reliability index data. The third set of multiplexers 208 is further coupled with the first processing circuit 202, and configured to receive the sixth set of reliability index data. Further, the third set of multiplexers 208 is configured to receive the third set of select signals from the first processing circuit 202. For example, the fifth multiplexer 208a has a first input terminal that is coupled with the programming circuit 104, and configured to receive the first reliability index data DO1 of the first set of reliability index data. The fifth multiplexer 208a further has a second input terminal and a select terminal that are coupled with the first processing circuit 202, and configured to receive the sixth reliability index data DO2 of the sixth set of reliability index data and the third select signal SS3 of the third set of select signals, respectively.

The fifth multiplexer 208a is further configured to select and output, at an output terminal thereof based on the third select signal SS3, one of the first and sixth reliability index data DO1 and DO2 as eleventh reliability index data DO3 of an eleventh set of reliability index data associated with the fuse circuit 102. In an embodiment, when the first processing circuit 202 deactivates the third select signal SS3 (i.e., generates the third select signal SS3 at a logic low state), the first reliability index data DO1 is selected and outputted as the eleventh reliability index data D03. Further, when the first processing circuit 202 activates the third select signal SS3 (i.e., generates the third select signal SS3 at a logic high state), the sixth reliability index data DO2 is selected and outputted as the eleventh reliability index data D03. The eleventh reliability index data DO3 is indicative of a third fuse pair. It will be apparent to a person skilled in the art that each multiplexer of the third set of multiplexers 208 (such as the sixth multiplexer 208b) may output corresponding reliability index data of the eleventh set of reliability index data in a similar manner as described above. Thus, based on the third set of select signals, the third set of multiplexers 208 is further configured to select and output one of the first and sixth sets of reliability index data as the eleventh set of reliability index data.

The first decoding circuitry 106 further includes a fourth set of multiplexers 210 of which seventh and eighth multiplexers 210a and 210b are shown, and a fifth set of multiplexers 212 of which ninth and tenth multiplexers 212a and 212b are shown. It will be apparent to a person skilled in the art that the fourth and fifth sets of multiplexers 210 and 212 are shown to include two multiplexers each (i.e., the seventh and eighth multiplexers 210a and 210b and the ninth and tenth multiplexers 212a and 212b) to make the illustrations concise and clear, and should not be considered as a limitation of the present disclosure. A number of multiplexers included in each of the fourth and fifth sets of multiplexers 210 and 212 is equal to the number of fuses of the fuse circuit 102.

The fourth set of multiplexers 210 is coupled with the programming circuit 104, and configured to receive the second set of reliability index data. The fourth set of multiplexers 210 is further coupled with the first processing circuit 202, and configured to receive the seventh set of reliability index data. Further, the fourth set of multiplexers 210 is configured to receive the fourth set of select signals from the first processing circuit 202. For example, the seventh multiplexer 210a has a first input terminal that is coupled with the programming circuit 104, and configured to receive the second reliability index data TO1 of the second set of reliability index data. The seventh multiplexer 210a further has a second input terminal and a select terminal that are coupled with the first processing circuit 202, and configured to receive the seventh reliability index data TO3 of the seventh set of reliability index data and the fourth select signal SS4 of the fourth set of select signals, respectively.

The seventh multiplexer 210a is further configured to select and output, at an output terminal thereof based on the fourth select signal SS4, one of the second and seventh reliability index data TO1 and TO3 as twelfth reliability index data TO5 of a twelfth set of reliability index data associated with the fuse circuit 102. In an embodiment, when the first processing circuit 202 deactivates the fourth select signal SS4 (i.e., generates the fourth select signal SS4 at a logic low state), the second reliability index data TO1 is selected and outputted as the twelfth reliability index data T05. Further, when the first processing circuit 202 activates the fourth select signal SS4 (i.e., generates the fourth select signal SS4 at a logic high state), the seventh reliability index data TO3 is selected and outputted as the twelfth reliability index data T05. It will be apparent to a person skilled in the art that each multiplexer of the fourth set of multiplexers 210 (such as the eighth multiplexer 210b) may output corresponding reliability index data of the twelfth set of reliability index data in a similar manner as described above. Thus, based on the fourth set of select signals, the fourth set of multiplexers 210 is further configured to select and output one of the second and seventh sets of reliability index data as the twelfth set of reliability index data.

The fifth set of multiplexers 212 is similarly coupled with the programming circuit 104, and configured to receive the third set of reliability index data. The fifth set of multiplexers 212 is further coupled with the first processing circuit 202, and configured to receive the eighth set of reliability index data. Further, the fifth set of multiplexers 212 is configured to receive the fourth set of select signals. For example, the ninth multiplexer 212a has a first input terminal that is coupled with the programming circuit 104, and configured to receive the third reliability index data TO2 of the third set of reliability index data. The ninth multiplexer 212a further has a second input terminal and a select terminal that are coupled with the first processing circuit 202, and configured to receive the eighth reliability index data TO4 of the eighth set of reliability index data and the fourth select signal SS4, respectively.

The ninth multiplexer 212a is further configured to select and output, at an output terminal thereof based on the fourth select signal SS4, one of the third and eighth reliability index data TO2 and TO4 as thirteenth reliability index data TO6 of a thirteenth set of reliability index data associated with the fuse circuit 102. In an embodiment, when the first processing circuit 202 deactivates the fourth select signal SS4, the third reliability index data TO2 is selected and outputted as the thirteenth reliability index data T06. Further, when the first processing circuit 202 activates the fourth select signal SS4, the eighth reliability index data TO4 is selected and outputted as the thirteenth reliability index data T06. The twelfth and thirteenth reliability index data TO5 and TO6 are associated with a same fuse of the fuse circuit 102, and are indicative of a fifth fuse triplet. It will be apparent to a person skilled in the art that each multiplexer of the fifth set of multiplexers 212 (such as the tenth multiplexer 212b) may output corresponding reliability index data of the thirteenth set of reliability index data in a similar manner as described above. Thus, based on the fourth set of select signals, the fifth set of multiplexers 212 is further configured to select and output one of the third and eighth sets of reliability index data as the thirteenth set of reliability index data.

The first decoding circuitry 106 further includes a sixth set of multiplexers 214 of which eleventh and twelfth multiplexers 214a and 214b are shown, and a seventh set of multiplexers 216 of which thirteenth and fourteenth multiplexers 216a and 216b are shown. It will be apparent to a person skilled in the art that the sixth and seventh sets of multiplexers 214 and 216 are shown to include two multiplexers each (i.e., the eleventh and twelfth multiplexers 214a and 214b and the thirteenth and fourteenth multiplexers 216a and 216b) to make the illustrations concise and clear, and should not be considered as a limitation of the present disclosure. A number of multiplexers included in each of the sixth and seventh sets of multiplexers 214 and 216 is equal to the number of fuses of the fuse circuit 102.

The sixth set of multiplexers 214 is coupled with the programming circuit 104, and configured to receive the fourth set of reliability index data. The sixth set of multiplexers 214 is further coupled with the first processing circuit 202, and configured to receive the ninth set of reliability index data. Further, the sixth set of multiplexers 214 is configured to receive the fifth set of select signals from the first processing circuit 202. For example, the eleventh multiplexer 214a has a first input terminal that is coupled with the programming circuit 104, and configured to receive the fourth reliability index data TR1 of the fourth set of reliability index data. The eleventh multiplexer 214a further has a second input terminal and a select terminal that are coupled with the first processing circuit 202, and configured to receive the ninth reliability index data TR3 of the ninth set of reliability index data and the fifth select signal SS5 of the fifth set of select signals, respectively.

The eleventh multiplexer 214a is further configured to select and output, at an output terminal thereof based on the fifth select signal SS5, one of the fourth and ninth reliability index data TR1 and TR3 as fourteenth reliability index data TR5 of a fourteenth set of reliability index data associated with the fuse circuit 102. In an embodiment, when the first processing circuit 202 deactivates the fifth select signal SS5 (i.e., generates the fifth select signal SS5 at a logic low state), the fourth reliability index data TR1 is selected and outputted as the fourteenth reliability index data TR5. Further, when the first processing circuit 202 activates the fifth select signal SS5 (i.e., generates the fifth select signal SS5 at a logic high state), the ninth reliability index data TR3 is selected and outputted as the fourteenth reliability index data TR5. It will be apparent to a person skilled in the art that each multiplexer of the sixth set of multiplexers 214 (such as the twelfth multiplexer 214b) may output corresponding reliability index data of the fourteenth set of reliability index data in a similar manner as described above. Thus, based on the fifth set of select signals, the sixth set of multiplexers 212 is further configured to select and output one of the fourth and ninth sets of reliability index data as the fourteenth set of reliability index data.

The seventh set of multiplexers 216 is similarly coupled with the programming circuit 104, and configured to receive the fifth set of reliability index data. The seventh set of multiplexers 216 is further coupled with the first processing circuit 202, and configured to receive the tenth set of reliability index data. Further, the seventh set of multiplexers 216 is configured to receive the fifth set of select signals. For example, the thirteenth multiplexer 216a has a first input terminal that is coupled with the programming circuit 104, and configured to receive the fifth reliability index data TR2 of the fifth set of reliability index data. The thirteenth multiplexer 216a further has a second input terminal and a select terminal that are coupled with the first processing circuit 202, and configured to receive the tenth reliability index data TR4 of the tenth set of reliability index data and the fifth select signal SS5, respectively.

The thirteenth multiplexer 216a is further configured to select and output, at an output terminal thereof based on the fifth select signal SS5, one of the fifth and tenth reliability index data TR2 and TR4 as fifteenth reliability index data TR6 of a fifteenth set of reliability index data associated with the fuse circuit 102. In an embodiment, when the first processing circuit 202 deactivates the fifth select signal SS5, the fifth reliability index data TR2 is selected and outputted as the fifteenth reliability index data TR6. Further, when the first processing circuit 202 activates the fifth select signal SS5, the tenth reliability index data TR4 is selected and outputted as the fifteenth reliability index data TR6. The fourteenth and fifteenth reliability index data TR5 and TR6 are associated with a same fuse of the fuse circuit 102, and are indicative of a sixth fuse triplet. It will be apparent to a person skilled in the art that each multiplexer of the seventh set of multiplexers 216 may output corresponding reliability index data of the fifteenth set of reliability index data in a similar manner as described above. Thus, based on the fifth set of select signals, the fifth set of multiplexers 212 is further configured to select and output one of the fifth and tenth sets of reliability index data as the fifteenth set of reliability index data.

The third set of functional index data, the third set of control index data, and the eleventh through fifteenth sets of reliability index data constitute the second configuration data CF2. In other words, the second configuration data CF2 includes the third set of functional index data, the third set of control index data, and the eleventh through fifteenth sets of reliability index data. Thus, the third set of functional index data and the third set of control index data indicate which fuses of the fuse circuit 102 are the functional and control fuses, respectively. Further, the eleventh set of reliability index data indicates which fuses of the fuse circuit 102 form fuse pairs for double-OR operations. Similarly, the twelfth and thirteenth sets of reliability index data indicate which fuses of the fuse circuit 102 form fuse triplets for triple-OR operations, whereas the fourteenth and fifteenth sets of reliability index data indicate which fuses of the fuse circuit 102 form fuse triplets for triple-voting operations.

The first configuration data CF1 is indicative of an initial configuration of the fuse circuit 102. The initial configuration of the fuse circuit 102 may indicate that the first set of fuses 114a is reserved to be utilized for various functional operations and the second and third sets of fuses 114b and 114c are reserved to be utilized for various control operations. Further, the third configuration data is generated by the first processing circuit 202 based on the override data OVR. The third configuration data thus includes indexes that are modified based on the utilization of various control fuses (e.g., the third set of fuses 114c) for the functional operations. As the second configuration data CF2 is generated based on the first configuration data CF1 and the third configuration data, the second configuration data CF2 includes a combination of the first configuration data CF1 and the third configuration data. In other words, the second configuration data CF2 includes the indexes that are unaffected (i.e., are same as that of the initial configuration) by the utilization of various control fuses for the functional operations and the indexes that are modified based on the utilization of various control fuses for the functional operations. Thus, the execution of the functional operations (such as the set of functional operations) based on the second configuration data CF2 utilizes additional fuses as compared to that based on the first configuration data CF1.

Figure 3:
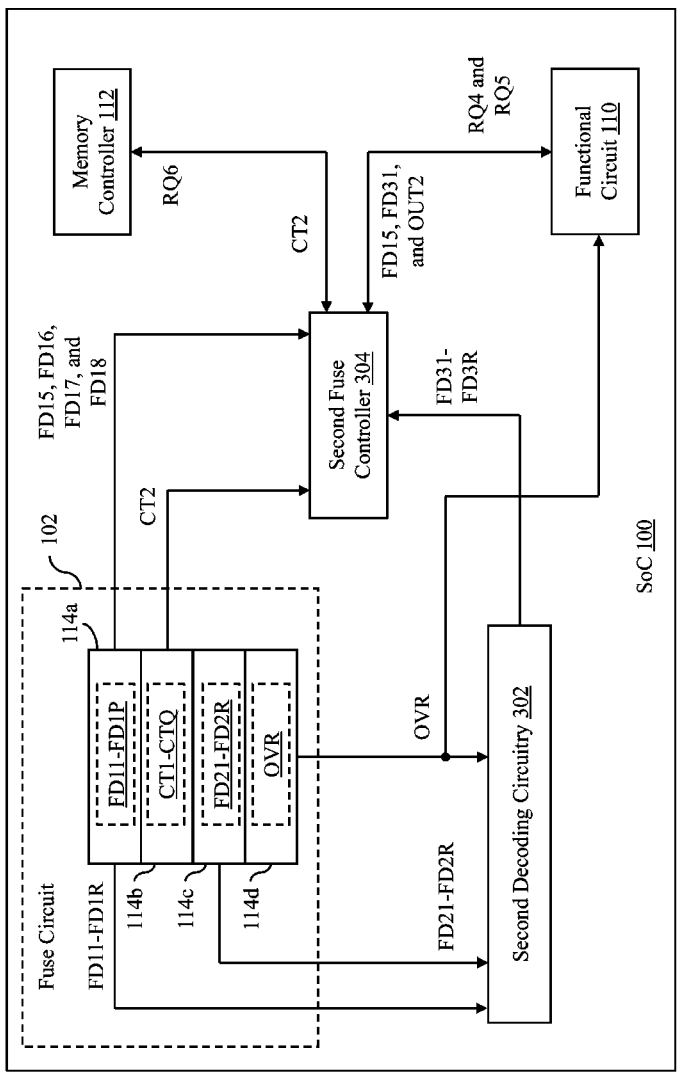
FIG. 3 illustrates a schematic block diagram of the SoC in accordance with another embodiment of the present disclosure.

FIG. 3 illustrates a schematic block diagram of the SoC 100 in accordance with another embodiment of the present disclosure. The SoC 100 of FIG. 3 includes the fuse circuit 102, second decoding circuitry 302, a second fuse controller 304, the functional circuit 110, and the memory controller 112.

The fuse circuit 102 includes various fuses that are configured to store various data. In the present disclosure, one or more control fuses that are unutilized for the control operations are utilized for the functional operations. The fuse circuit 102 thus includes the first through third sets of fuses 114a-114c, where the first and second sets of fuses 114a and 114b correspond to the functional and control fuses, respectively, and the third set of fuses 114c corresponds to the control fuses that are utilized as the functional fuses in the SoC 100. The first set of fuses 114a is configured to store the first set of functional data FD11-FD1P. The first set of functional data FD11-FD1P is associated with the set of functional operations of the SoC 100. The second set of fuses 114b is configured to store the set of control data CT1-CTQ. The set of control data CT1-CTQ is associated with the set of control operations of the SoC 100. The third set of fuses 114c is configured to store the second set of functional data FD21-FD2R. The second set of functional data FD21-FD2R is associated with the subset of functional operations of the set of functional operations. The fuse circuit 102 further includes the fourth set of fuses 114d that is configured to store the override data OVR.

The second decoding circuitry 302 is coupled with the fuse circuit 102, and configured to retrieve the override data OVR from the fuse circuit 102. The second decoding circuitry 302 is further configured to receive, from the fuse circuit 102, a fifth subset of functional data of the first set of functional data FD11-FD1P and the second set of functional data FD21-FD2R. It will be apparent to a person skilled in the art that the second decoding circuitry 302 receives the fifth subset of functional data of the first set of functional data FD11-FD1P and the second set of functional data FD21-FD2R from the fuse circuit 102 as a response to a query (not shown) provided to the fuse circuit 102 by the second decoding circuitry 302. In other words, the fifth subset of functional data of the first set of functional data FD11-FD1P and the second set of functional data FD21-FD2R are retrieved from the fuse circuit 102. In an embodiment, a number of fuses that store the fifth subset of functional data is equal to a number of fuses that store the second set of functional data FD21-FD2R. Thus, the fifth subset of functional data is hereinafter referred to and designated as the "fifth subset of functional data FD11-FD1R", where a value of "R" is less than a value of "P".

The second decoding circuitry 302 is further configured to output a third set of functional data FD31-FD3R based on the override data OVR, the fifth subset of functional data FD11-FD1R, and the second set of functional data FD21-FD2R. The set of functional operations are executed based on the third set of functional data FD31-FD3R. The structure of the second decoding circuitry 302 is explained in detail in conjunction with FIG. 4.

The second fuse controller 304 is coupled with the fuse circuit 102, the second decoding circuitry 302, the functional circuit 110, and the memory controller 112. The second fuse controller 304 may include suitable logic, circuitry, interfaces, and/or code, executable by the circuitry, that may be configured to perform one or more operations. For example, the second fuse controller 304 is configured to receive the third set of functional data FD31-FD3R from the second decoding circuitry 302.

The second fuse controller 304 may be configured to receive various requests from the functional circuit 110. For example, the second fuse controller 304 is further configured to receive, from the functional circuit 110, a fourth request RQ4 that is indicative of a third functional operation of the subset of functional operations. In such a scenario, the second fuse controller 304 is further configured to retrieve, from the fuse circuit 102 based on the fourth request RQ4, a sixth subset of functional data of the first set of functional data FD11-FD1P. The second fuse controller 304 is further configured to identify, from the third set of functional data FD31-FD3R, a seventh subset of functional data that is associated with the fourth request RQ4. For the sake of brevity and without deviating from the scope of the present disclosure, it is assumed that the sixth subset of functional data includes eighth functional data FD15, and the seventh subset of functional data includes ninth functional data FD31. The second fuse controller 304 is further configured to provide the retrieved eighth and ninth functional data FD15 and FD31 to the functional circuit 110 as a response to the fourth request RQ4. Further, the third functional operation is executed by the functional circuit 110 based on the eighth and ninth functional data FD15 and FD31.

The second fuse controller 304 may similarly be configured to receive a fifth request RQ5 that is indicative of a fourth functional operation of the subset of functional operations. For the sake of ongoing discussion, it is assumed that the fifth request RQ5 indicates that one of the first through third reliability operations is to be executed to facilitate the execution of the fourth functional operation. In such a scenario, the second fuse controller 304 is configured to retrieve, from the fuse circuit 102 based on the fifth request RQ5, an eighth subset of functional data of the first set of functional data FD11-FD1P. The second fuse controller 304 is further configured to identify, from the third set of functional data FD31-FD3R, a ninth subset of functional data that is associated with the fifth request RQ5. The second fuse controller 304 is further configured to execute one of the first through third reliability operations on the retrieved eighth and ninth subsets of functional data to generate second output data OUT2.

When the fifth request RQ5 indicates that the first reliability operation is to be executed, the eighth and ninth subsets of functional data include one functional data each (e.g., tenth and eleventh functional data FD16 and FD32). In such a scenario, the second fuse controller 304 is further configured to execute the first reliability operation on the tenth and eleventh functional data FD16 and FD32 to generate the second output data OUT2. Similarly, when the fifth request RQ5 indicates that the second or third reliability operation is to be executed, the ninth subset of functional data includes two functional data (e.g., twelfth and thirteenth functional data FD17 and FD18) and the tenth subset of functional data includes one functional data (e.g., fourteenth functional data FD33). In such a scenario, the second fuse controller 304 is further configured to execute one of the second and third reliability operations on the twelfth through fourteenth functional data FD17, FD18, and FD33 to generate the second output data OUT2. The second fuse controller 304 is further configured to provide the second output data OUT2 to the functional circuit 110 as a response to the fifth request RQ5. The fourth functional operation is executed by the functional circuit 110 based on the second output data OUT2.

The second fuse controller 304 may similarly be configured to receive various requests from the memory controller 112. For example, the second fuse controller 304 is further configured to receive, from the memory controller 112, a sixth request RQ6 that is indicative of a second control operation of the set of control operations. For the sake of ongoing discussion, it is assumed that the second control operation corresponds to a memory repair operation associated with a second memory (not shown) of the set of memories. In such a scenario, the second fuse controller 304 is configured to retrieve, from the fuse circuit 102 based on the sixth request RQ6, a second subset of control data of the set of control data CT1-CTQ. For the sake of brevity, it is assumed that the second subset of control data includes second control data CT2. The second fuse controller 304 is further configured to provide the retrieved second control data CT2 to the memory controller 112 as a response to the sixth request RQ6. Further, the second control operation is executed by the memory controller 112 based on the second control data CT2.

The functional circuit 110 is coupled with the fuse circuit 102 (i.e., the fourth set of fuses 114d), and configured to retrieve the override data OVR, and generate various requests indicative of various functional operations. For example, the functional circuit 110 is further configured to generate, based on the override data OVR, the fourth request RQ4 that is indicative of the third functional operation. The functional circuit 110 is further configured to provide the fourth request RQ4 to the second fuse controller 304. In response to the fourth request RQ4, the functional circuit 110 is further configured to receive the eighth and ninth functional data FD15 and FD31 from the second fuse controller 304. Further, based on the eighth and ninth functional data FD15 and FD31, the functional circuit 110 is configured to execute the third functional operation.

The functional circuit 110 is further configured to generate the fifth request RQ5 that is indicative of the fourth functional operation. The functional circuit 110 is further configured to provide the fifth request RQ5 to the second fuse controller 304. In response to the fifth request RQ5, the functional circuit 110 is further configured to receive the second output data OUT2 from the second fuse controller 304. Further, based on the second output data OUT2, the functional circuit 110 is configured to execute the fourth functional operation.

The memory controller 112 is coupled with the set of memories, and configured to generate various requests indicative of various control operations associated with the set of memories. For example, the memory controller 112 is configured to generate the sixth request RQ6 that is indicative of the second control operation associated with the second memory. The memory controller 112 is further configured to provide the sixth request RQ6 to the second fuse controller 304. In response to the sixth request RQ6, the memory controller 112 is further configured to receive the second control data CT2 from the second fuse controller 304. Further, based on the second control data CT2, the memory controller 112 is further configured to execute the second control operation on the second memory. It will be apparent to a person skilled in the art that the memory controller 112 may execute control operations (e.g., memory repair operations) on other memories of the set of memories in a similar manner as described above.

It will be apparent to a person skilled in the art that the scope of the present disclosure is not limited to the second control operation being a memory repair operation. In various other embodiments, the second control operation may correspond to various other control operations of the SoC 100 (e.g., a trim operation) without deviating from the scope of the present disclosure. Such control operations may be executed in a manner similar to the execution of the memory repair operation described above. However, in such a scenario, the functions executed by the memory controller 112 may be executed by the functional circuit 110.

Figure 4:
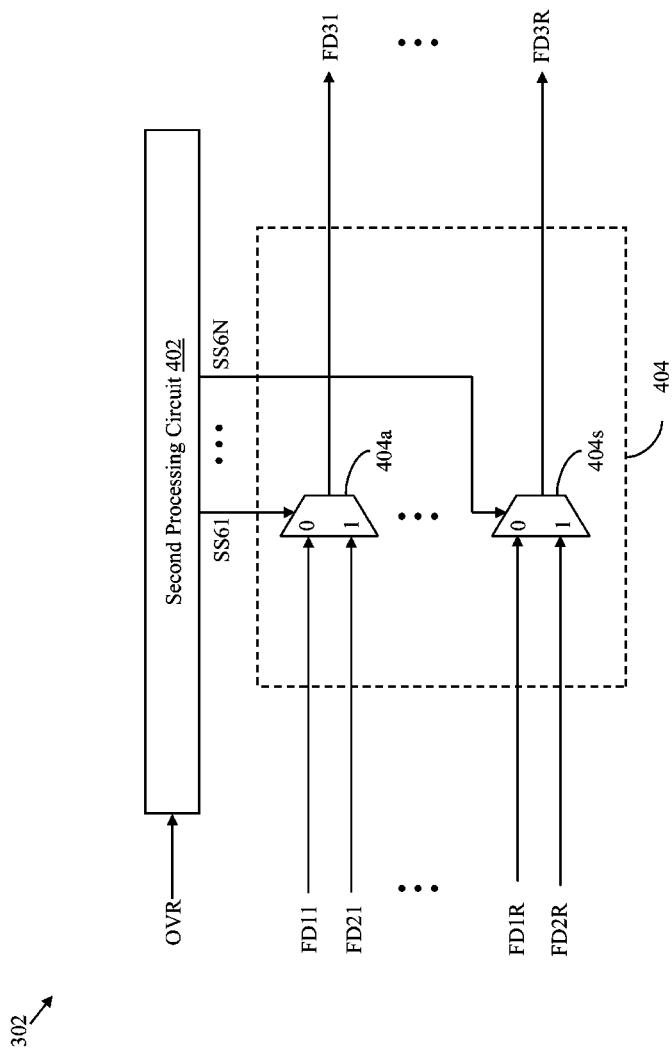
FIG. 4 illustrates a schematic block diagram of second decoding circuitry of the SoC of FIG. 3 in accordance with an embodiment of the present disclosure.

FIG. 4 illustrates a schematic block diagram of the second decoding circuitry 302 in accordance with an embodiment of the present disclosure. The second decoding circuitry 302 includes a second processing circuit 402 that is coupled with the fuse circuit 102 (i.e., the fourth set of fuses 114d). The second processing circuit 402 may include suitable logic, circuit, interfaces, and/or code, executable by the circuit, that may be configured to perform one or more operations. For example, the second processing circuit 402 is configured to retrieve the override data OVR from the fuse circuit 102 (i.e., the fourth set of fuses 114d). Based on the override data OVR, the first processing circuit 202 is configured to generate a sixth set of select signals SS61-SS6N.

The second decoding circuitry 302 further includes an eighth set of multiplexers 404. The eighth set of multiplexers 404 includes fifteenth through $s^{th}$ multiplexers 404a and 404s. In an embodiment, a number of multiplexers included in the eighth set of multiplexers 404 is equal to the number of fuses included in the third set of fuses 114c. The eighth set of multiplexers 404 is coupled with one or more fuses of the first set of fuses 114a, and configured to receive the fifth subset of functional data FD11-FD1R. Similarly, the eighth set of multiplexers 404 is further coupled with the third set of fuses 114c, and configured to receive the second set of functional data FD21-FD2R. Further, the eighth set of multiplexers 404 is coupled with the second processing circuit 402, and configured to receive the sixth set of select signals SS61-SS6N. For example, the fifteenth multiplexer 404a has a first input terminal that is coupled with one fuse of the one or more fuses, and configured to receive one functional data of the fifth subset of functional data FD11-FD1R. The fifteenth multiplexer 404a further has a second input terminal that is coupled with one fuse of the third set of fuses 114c, and configured to receive one functional data of the second set of functional data FD21-FD2R. For the sake of ongoing discussion, it is assumed that the first input terminal of the fifteenth multiplexer 404a is configured to receive the first functional data FD11, and the second input terminal of the fifteenth multiplexer 404a is configured to receive the second functional data FD21. The fifteenth multiplexer 404a further has a select terminal that is coupled with the second processing circuit 402, and configured to receive a sixth select signal SS61 of the sixth set of select signals SS61-SS6N.

The fifteenth multiplexer 404a is further configured to select and output, at an output terminal thereof based on the sixth select signal SS61, one of the first and second functional data FD11 and FD21 as one functional data of the third set of functional data FD31-FD3R. For the sake of brevity, it is assumed that one of the first and second functional data FD11 and FD21 is selected and outputted as the ninth functional data FD31. In an embodiment, when the second processing circuit 402 deactivates the sixth select signal SS61 (i.e., generates the sixth select signal SS61 at a logic low state), the first functional data FD11 is selected and outputted as the ninth functional data FD31. Further, when the second processing circuit 402 activates the sixth select signal SS61 (i.e., generates the sixth select signal SS61 at a logic high state), the second functional data FD21 is selected and outputted as the ninth functional data FD31. It will be apparent to a person skilled in the art that each multiplexer of the eighth set of multiplexers 404 may output corresponding functional data of the third set of functional data FD31-FD3R in a similar manner as described above. Thus, based on the sixth set of select signals SS61-SS6N, the eighth set of multiplexers 404 is further configured to select and output one of the fifth subset of functional data FD11-FD1R and the second set of functional data FD21-FD2R as the third set of functional data FD31-FD3R.

Thus, in the SoC 100 of the present disclosure, one or more unutilized control fuses (e.g., the third set of fuses 114c) that are reserved to be utilized for one or more control operations are utilized for various functional operations (e.g., the subset of functional operations). The utilization of various unutilized control fuses (e.g., the third set of fuses 114c) as the functional fuses results in an increase in a number of functional fuses available for the set of functional operations. The increased number of functional fuses may be utilized for increasing a reliability of various functional operations of the set of functional operations and for fulfilling an additional requirement of functional fuses in the SoC 100. As a result, a utilization of the fuse circuit 102 is greater than that of a fuse circuit of a conventional SoC where a configuration of the fuse circuit is fixed. Further, as the increased number of functional fuses may be utilized for fulfilling the additional requirement of functional fuses in the SoC 100, a need for adding another fuse circuit in the SoC 100 to fulfil the additional requirement of functional fuses is eliminated. Hence, a size and a manufacturing cost of the SoC 100 of the present disclosure are significantly less than that of the conventional SoC that requires another fuse circuit to fulfil the additional requirement of functional fuses.

While various embodiments of the present disclosure have been illustrated and described, it will be clear that the present disclosure is not limited to these embodiments only. Numerous modifications, changes, variations, substitutions, and equivalents will be apparent to those skilled in the art, without departing from the spirit and scope of the present disclosure, as described in the claims. Further, unless stated otherwise, terms such as "first" and "second" are used to arbitrarily distinguish between the elements such terms describe. Thus, these terms are not necessarily intended to indicate temporal or other prioritization of such elements.

The invention claimed is:

1. A system-on-chip (SoC), comprising:
a fuse circuit, comprising:
a first set of fuses that corresponds to functional fuses, and is configured to store a first set of functional data, wherein the first set of functional data is associated with a set of functional operations of the SoC;
a second set of fuses that corresponds to control fuses utilized as the functional fuses, wherein the second set of fuses is configured to store a second set of functional data, and wherein the second set of functional data is associated with a subset of functional operations of the set of functional operations; and
a third set of fuses that is configured to store override data, wherein the override data is indicative of an association between the second set of fuses and one or more fuses of the first set of fuses; and
decoding circuitry that is coupled with the fuse circuit, and configured to (i) retrieve the override data from the fuse circuit, (ii) receive first configuration data associated with a configuration of the fuse circuit, and (iii) output, based on the override data and the first configuration data, second configuration data associated with the configuration of the fuse circuit, wherein the set of functional operations is executed based on the second configuration data.

2. The SoC of claim 1, further comprising a programming circuit that is coupled with the decoding circuitry, and configured to generate and provide the first configuration data to the decoding circuitry.

3. The SoC of claim 1, wherein the first configuration data includes a first set of functional index data associated with the fuse circuit and a first set of control index data associated with the fuse circuit.

4. The SoC of claim 3, wherein the decoding circuitry includes a processing circuit that is coupled with the fuse circuit, and configured to retrieve the override data from the fuse circuit, and generate a second set of functional index data associated with the fuse circuit and a second set of control index data associated with the fuse circuit, wherein each functional index data of the first and second sets of functional index data is associated with a corresponding fuse of the fuse circuit, and indicates whether the corresponding fuse is a functional fuse, and wherein each control index data of the first and second sets of control index data is associated with a corresponding fuse of the fuse circuit, and indicates whether the corresponding fuse is a control fuse.

5. The SoC of claim 4, wherein:
the processing circuit is further configured to generate first and second sets of select signals based on the override data,
the decoding circuitry further includes first and second sets of multiplexers that are coupled with the processing circuit,
each multiplexer of the first set of multiplexers is configured to receive first and second functional index data of the first and second sets of functional index data, respectively, and a first select signal of the first set of select signals, and select and output, based on the first select signal, one of the first and second functional index data as third functional index data of a third set of functional index data associated with the fuse circuit,
each multiplexer of the second set of multiplexers is configured to receive first and second control index data of the first and second sets of control index data, respectively, and a second select signal of the second set of select signals, and select and output, based on the second select signal, one of the first and second control index data as third control index data of a third set of control index data associated with the fuse circuit, and
the second configuration data includes the third set of functional index data and the third set of control index data.

6. The SoC of claim 1, further comprising:
a functional circuit that is coupled with the fuse circuit, and configured to retrieve the override data from the fuse circuit, and generate a first request indicative of a first functional operation of the subset of functional operations; and
a fuse controller that is coupled with the functional circuit, the fuse circuit, and the decoding circuitry, and configured to:
receive the first request and the second configuration data from the functional circuit and the decoding circuitry, respectively;
retrieve, from the fuse circuit based on the first request and the second configuration data, first and second subsets of functional data of the first and second sets of functional data, respectively; and
provide the retrieved first and second subsets of functional data to the functional circuit as a response to the first request, wherein the functional circuit is further configured to execute the first functional operation based on the first and second subsets of functional data.

7. The SoC of claim 1, further comprising:
a functional circuit that is configured to generate a second request indicative of a second functional operation of the subset of functional operations; and
a fuse controller that is coupled with the functional circuit, the fuse circuit, and the decoding circuitry, and configured to:
receive the second request and the second configuration data from the functional circuit and the decoding circuitry, respectively;
retrieve, from the fuse circuit based on the second request and the second configuration data, third and fourth subsets of functional data of the first and second sets of functional data, respectively;
execute one of first and second reliability operations on the retrieved third and fourth subsets of functional data to generate output data; and
provide the output data to the functional circuit as a response to the second request, wherein the functional circuit is further configured to execute the second functional operation based on the output data.

8. The SoC of claim 7, wherein the first reliability operation corresponds to a logical OR operation that is executed on first and second functional data of the third and fourth subsets of functional data, respectively, and the second reliability operation corresponds to one of a logical OR operation and a redundancy operation that is executed on third and fourth functional data of the third subset of functional data and fifth functional data of the fourth subset of functional data.

9. The SoC of claim 7, wherein:
the decoding circuitry includes a processing circuit that is coupled with the fuse circuit, and configured to retrieve the override data from the fuse circuit,
when the first reliability operation is to be executed for the second functional operation, the first configuration data includes a first set of reliability index data associated with the fuse circuit, and the processing circuit is configured to generate a second set of reliability index data associated with the fuse circuit based on the override data,
each reliability index data of the first set of reliability index data is associated with a corresponding fuse of the fuse circuit, and first reliability index data of the first set of reliability index data is indicative of a first fuse pair that is associated with the fuse circuit and facilitates the execution of the first reliability operation, and
each reliability index data of the second set of reliability index data is associated with a corresponding fuse of the fuse circuit, and second reliability index data of the second set of reliability index data is indicative of a second fuse pair that is associated with the fuse circuit and facilitates the execution of the first reliability operation.

10. The SoC of claim 9, wherein:
the processing circuit is further configured to generate a third set of select signals based on the override data,
the decoding circuitry further includes a third set of multiplexers that is coupled with the processing circuit,
each multiplexer of the third set of multiplexers is configured to receive the first and second reliability index data of the first and second sets of reliability index data, respectively, and a third select signal of the third set of select signals, and select and output, based on the third select signal, one of the first and second reliability index data as third reliability index data of a third set of reliability index data associated with the fuse circuit, and
the second configuration data includes the third set of reliability index data.

11. The SoC of claim 7, wherein:
the decoding circuitry includes a processing circuit that is coupled with the fuse circuit, and configured to retrieve the override data from the fuse circuit,
when the second reliability operation is to be executed for the second functional operation, the first configuration data includes fourth and fifth sets of reliability index data associated with the fuse circuit, and the processing circuit is configured to generate sixth and seventh sets of reliability index data associated with the fuse circuit based on the override data,
each reliability index data of the fourth and fifth sets of reliability index data is associated with a corresponding fuse of the fuse circuit, and fourth and fifth reliability index data of the fourth and fifth sets of reliability index data, respectively, are indicative of a first fuse triplet that is associated with the fuse circuit and facilitates the execution of the second reliability operation, and
each reliability index data of the sixth and seventh sets of reliability index data is associated with a corresponding fuse of the fuse circuit, and sixth and seventh reliability index data of the sixth and seventh sets of reliability index data, respectively, are indicative of a second fuse triplet that is associated with the fuse circuit and facilitates the execution of the second reliability operation.

12. The SoC of claim 11, wherein:
the processing circuit is further configured to generate a fourth set of select signals based on the override data,
the decoding circuitry further includes fourth and fifth sets of multiplexers that are coupled with the processing circuit,
each multiplexer of the fourth set of multiplexers is configured to receive the fourth and sixth reliability index data of the fourth and sixth sets of reliability index data, respectively, and a fourth select signal of the fourth set of select signals, and select and output, based on the fourth select signal, one of the fourth and sixth reliability index data as eighth reliability index data of an eighth set of reliability index data associated with the fuse circuit,
each multiplexer of the fifth set of multiplexers is configured to receive the fifth and seventh reliability index data of the fifth and seventh sets of reliability index data, respectively, and the fourth select signal, and select and output, based on the fourth select signal, one of the fifth and seventh reliability index data as ninth reliability index data of a ninth set of reliability index data associated with the fuse circuit, and
the second configuration data includes the eighth and ninth sets of reliability index data.

13. The SoC of claim 1, wherein the fuse circuit further includes a fourth set of fuses that corresponds to the control fuses, and is configured to store a set of control data, and wherein the set of control data is associated with a set of control operations of the SoC.

14. The SoC of claim 13, further comprising:
a memory controller that is configured to generate a third request indicative of a control operation of the set of control operations; and
a fuse controller that is coupled with the memory controller, the fuse circuit, and the decoding circuitry, and configured to:
receive the third request and the second configuration data from the memory controller and the decoding circuitry, respectively;
retrieve, from the fuse circuit based on the third request and the second configuration data, a subset of control data of the set of control data; and
provide the retrieved subset of control data to the memory controller as a response to the third request, wherein the memory controller is further configured to execute the control operation based on the subset of control data.

15. A system-on-chip (SoC), comprising:
a fuse circuit, comprising:
a first set of fuses that corresponds to functional fuses, and is configured to store a first set of functional data, wherein the first set of functional data is associated with a set of functional operations of the SoC;
a second set of fuses that corresponds to control fuses utilized as the functional fuses, wherein the second set of fuses is configured to store a second set of functional data, and wherein the second set of functional data is associated with a subset of functional operations of the set of functional operations; and
a third set of fuses that is configured to store override data, wherein the override data is indicative of an association between the second set of fuses and one or more fuses of the first set of fuses; and decoding circuitry that is coupled with the fuse circuit, and configured to:
retrieve the override data from the fuse circuit;
receive, from the fuse circuit, a first subset of functional data of the first set of functional data, and the second set of functional data; and
output a third set of functional data based on the override data, the first subset of functional data, and the second set of functional data, wherein the set of functional operations is executed based on the third set of functional data.

16. The SoC of claim 15, wherein the decoding circuitry includes:
a processing circuit that is coupled with the fuse circuit, and configured to retrieve the override data from the fuse circuit, and generate a set of select signals; and
a set of multiplexers coupled with the fuse circuit and the processing circuit, wherein each multiplexer of the set of multiplexers is configured to receive a select signal of the set of select signals and first and second functional data of the first subset of functional data and the second set of functional data, respectively, and select and output, based on the select signal, one of the first and second functional data as third functional data of the third set of functional data.

17. The SoC of claim 15, further comprising:
a functional circuit that is coupled with the fuse circuit, and configured to retrieve the override data from the fuse circuit, and generate a first request indicative of a first functional operation of the subset of functional operations; and
a fuse controller that is coupled with the functional circuit, the decoding circuitry, and the fuse circuit, and configured to:
receive the first request and the third set of functional data from the functional circuit and the decoding circuitry, respectively;
retrieve, from the fuse circuit based on the first request, a second subset of functional data of the first set of functional data;
identify, from the third set of functional data, a third subset of functional data that is associated with the first request; and
provide the second and third subsets of functional data to the functional circuit as a response to the first request, wherein the functional circuit is further configured to execute the first functional operation based on the second and third subsets of functional data.

18. The SoC of claim 15, further comprising:
a functional circuit that is configured to generate a second request indicative of a second functional operation of the subset of functional operations; and
a fuse controller that is coupled with the functional circuit, the fuse circuit, and the decoding circuitry, and configured to:
receive the second request and the third set of functional data from the functional circuit and the decoding circuitry, respectively;
retrieve, from the fuse circuit based on the second request, a fourth subset of functional data of the first set of functional data;
identify, from the third set of functional data, a fifth subset of functional data that is associated with the second request;
execute one of first and second reliability operations on the fourth and fifth subsets of functional data to generate output data; and
provide the output data to the functional circuit as a response to the second request, wherein the functional circuit is further configured to execute the second functional operation based on the output data.

19. The SoC of claim 18, wherein the first reliability operation corresponds to a logical OR operation that is executed on fourth and fifth functional data of the fourth and fifth subsets of functional data, respectively, and the second reliability operation corresponds to one of a logical OR operation and a redundancy operation that is executed on sixth and seventh functional data of the fourth subset of functional data and eighth functional data of the fifth subset of functional data.

20. The SoC of claim 15, wherein the fuse circuit further includes a fourth set of fuses that corresponds to the control fuses, and is configured to store a set of control data, and wherein the set of control data is associated with a set of control operations of the SoC.

* * * * *